US012044709B2

(12) United States Patent
Tamura et al.

(10) Patent No.: US 12,044,709 B2
(45) Date of Patent: Jul. 23, 2024

(54) MAGNETIC SENSOR AND CURRENT DETECTING APPARATUS INCLUDING THE SAME

(71) Applicant: Alps Alpine Co., Ltd., Tokyo (JP)

(72) Inventors: Manabu Tamura, Miyagi-ken (JP); Masaomi Shirasaka, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 227 days.

(21) Appl. No.: 17/714,019

(22) Filed: Apr. 5, 2022

(65) Prior Publication Data

US 2022/0229094 A1   Jul. 21, 2022

Related U.S. Application Data

(63) Continuation of application No. PCT/JP2020/037911, filed on Oct. 6, 2020.

(30) Foreign Application Priority Data

Oct. 8, 2019   (JP) .................. 2019-185174

(51) Int. Cl.
 *G01R 15/20* (2006.01)
 *G01R 19/00* (2006.01)
 *G01R 33/09* (2006.01)

(52) U.S. Cl.
 CPC ....... *G01R 15/207* (2013.01); *G01R 19/0092* (2013.01); *G01R 33/091* (2013.01)

(58) Field of Classification Search
 CPC ............... G01R 1/067; G01R 1/07307; G01R 31/2891; G01R 33/091; G01R 33/093
 See application file for complete search history.

(56) References Cited

U.S. PATENT DOCUMENTS

| 10,969,410 B2 | 4/2021 | Sugito et al. |
| 11,041,887 B2 | 6/2021 | Esaka et al. |
| 11,150,274 B2 * | 10/2021 | Tamura .............. G01R 19/0092 |

FOREIGN PATENT DOCUMENTS

| JP | 2014-98633 | 5/2014 |
| JP | 2018-96794 | 6/2018 |
| WO | WO 2018/092404 | 5/2018 |
| WO | WO 2019/117170 | 6/2019 |
| WO | WO-2021220620 A1 * | 11/2021 |

* cited by examiner

*Primary Examiner* — Tung X Nguyen
(74) *Attorney, Agent, or Firm* — Crowell & Moring LLP

(57) ABSTRACT

A magnetic sensor is configured such that, even if noise is generated from a bus bar at ON-OFF switching of a voltage for controlling the current to be measured flowing through the bus bar, the influence of the noise on the result of measurement made by the magnetic sensor can be reduced. The magnetic sensor includes a main body having two opposing sides, the main body being capable of measuring a value of a current to be measured flowing through a bus bar by detecting a magnetic field induced by the current to be measured, wherein a signal terminal for outputting a detection signal and a supply terminal for supplying electrical power to the main body extend only from one of the two sides of the main body.

3 Claims, 6 Drawing Sheets

MAGNETIC SENSOR AND CURRENT DETECTING APPARATUS INCLUDING THE SAME

CLAIM OF PRIORITY

This application is a Continuation of International Application No. PCT/JP2020/037911 filed on Oct. 6, 2020, which claims benefit of priority to Japanese Patent Application No. 2019-185174 filed on Oct. 8, 2019. The entire contents of each application noted above are hereby incorporated by reference.

BACKGROUND

1. Field of the Disclosure

The present disclosure relates to a magnetic sensor capable of measuring a current flowing through a bus bar and to a current detecting apparatus including the magnetic sensor.

2. Description of the Related Art

A current sensor disclosed in Japanese Unexamined Patent Application Publication No. 2014-98633 includes a U-shaped current path, a magnetoelectric transducer that detects a magnetic field generated when a current flows through the current path, an internal magnetic shield surrounding at least part of the U-shape and the magnetoelectric transducer, and an external magnetic shield surrounding at least part of the internal magnetic shield. The magnetoelectric transducer is disposed at a center within a plane of a tabular current path as viewed along the normal to the current path.

However, the configuration in which the magnetoelectric transducer is disposed in the current path, like the current sensor disclosed in Japanese Unexamined Patent Application Publication No. 2014-98633, can cause noise generated from the current path at ON-OFF switching of a voltage for controlling the current to enter through an output terminal or a supply terminal of the magnetoelectric transducer to affect the result of magnetoelectric conversion.

SUMMARY

The present disclosure provides a magnetic sensor capable of measuring a current flowing through a bus bar and a current detecting apparatus including the magnetic sensor and the bus bar, in which, even if noise is generated from the bus bar at ON-OFF switching of a voltage for controlling the current to be measured flowing through the bus bar, the influence on the detection result can be reduced.

A magnetic sensor according a first aspect of the present disclosure includes a main body having two opposing sides, the main body being capable of measuring a value of a current to be measured flowing through a bus bar by detecting a magnetic field induced by the current to be measured, wherein a signal terminal for outputting a detection signal and a supply terminal for supplying electrical power to the main body extend only from one of the two sides of the main body.

Thus, by disposing one side on which the signal terminal and the supply terminal are provided away from the bus bar, even if noise is generated from the bus bar at ON-OFF switching of the voltage for controlling the current to be measured flowing through the bus bar, the influence on the detection result can be reduced.

A current detecting apparatus according to a second aspect of the present disclosure includes a plate-like bus bar and a magnetic sensor including a main body capable of measuring a current flowing through the bus bar, wherein a signal terminal for outputting a detection signal and a supply terminal for supplying electric power to the main body extend from the main body, wherein the main body includes a portion overlapping the bus bar and a portion not overlapping the bus bar as viewed along a thickness direction of the bus bar, and wherein the signal terminal and the supply terminal extend from the portion of the main body not overlapping the bus bar without overlapping the bus bar.

This allows the signal terminal and the supply terminal to be disposed not overlapping the bus bar as viewed along the thickness of the bus bar, allows being distant from the bus bar. For this reason, even if noise is generated from the bus bar at ON-OFF switching of the voltage for controlling the current to be measured flowing through the bus bar, the influence on the detection result can be reduced.

DESCRIPTION OF THE EXEMPLARY EMBODIMENTS

Magnetic sensors and current detecting apparatuses according to embodiments of the present disclosure will be described in detail hereinbelow with reference to the drawings.

Figure 1A:
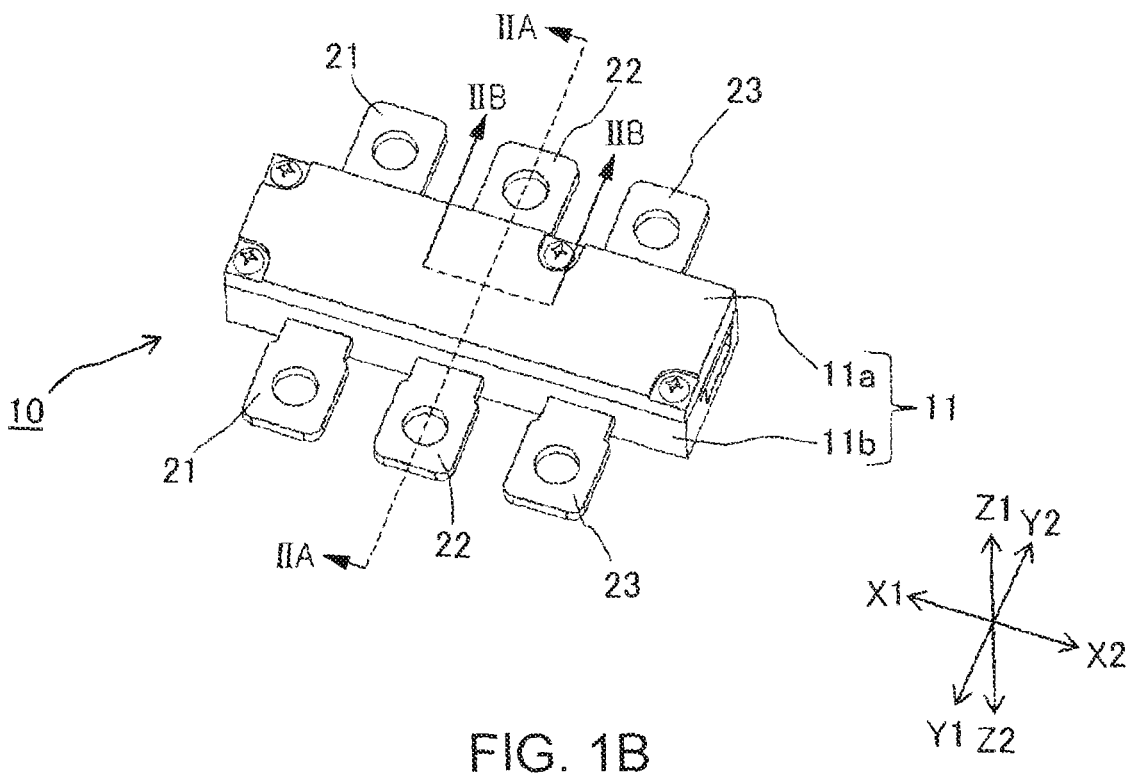
FIG. 1A is a perspective view of a current detecting apparatus according to an embodiment of the present disclosure, illustrating the basic configuration thereof.

First, the basic configuration of a current detecting apparatus 10 according to an embodiment will be described with reference to FIGS. 1A and 1B and FIGS. 2A and 2B. The sizes and relative positions of the individual members will be described for each embodiment with reference to FIGS. 3A to 6. FIG. 1A is a perspective view of the current detecting apparatus 10 illustrating the basic configuration thereof, FIG. 1B is an exploded perspective view of the current detecting apparatus 10, FIG. 2A is a cross-sectional view taken along line IIA-IIA of FIG. 1A, and FIG. 2B is a cross-sectional view taken along line IIB-IIB of FIG. 1A.

Figure 1B:
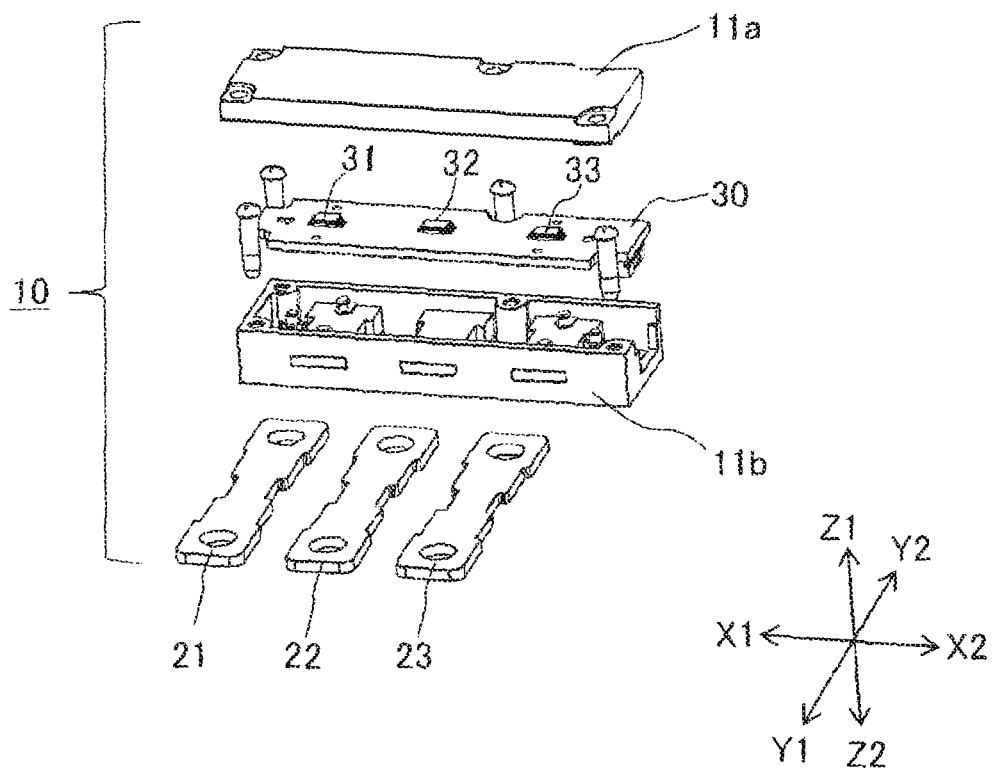
FIG. 1B is an exploded perspective view of the current detecting apparatus.
Figure 2A:
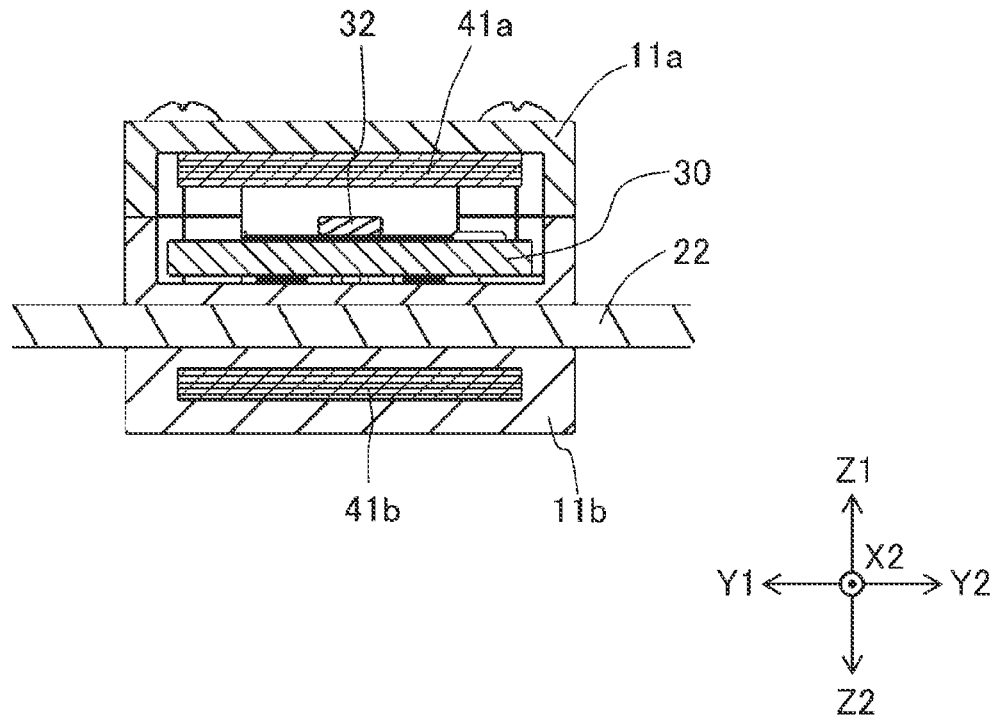
FIG. 2A is a cross-sectional view taken along line IIA-IIA of FIG. 1A.

As shown in FIGS. 1A and 1B, the current detecting apparatus 10 includes a substantially rectangular parallelepiped casing 11 in which a cover 11a on the upper side (the Z1 side in FIGS. 1A and 1B) and a case member 11b on the lower side (the Z2 side in FIGS. 1A and 1B) are fixed to each other. Three bus bars 21, 22, and 23 pass through the case member 11b along the width of the casing 11 (in the Y1-Y2 direction in FIGS. 1A and 1B).

The three bus bars 21, 22, and 23 are electrically conductive plates with the same shape, which are arranged so that the two opposing surfaces correspond to each other in the vertical direction of the casing 11. The bus bars 21, 22, and 23 extend linearly along the width of the casing 11 and are disposed at regular intervals along the length of the casing 11 (in the X1-X2 direction of FIGS. 1A and 1B).

Figure 2B:
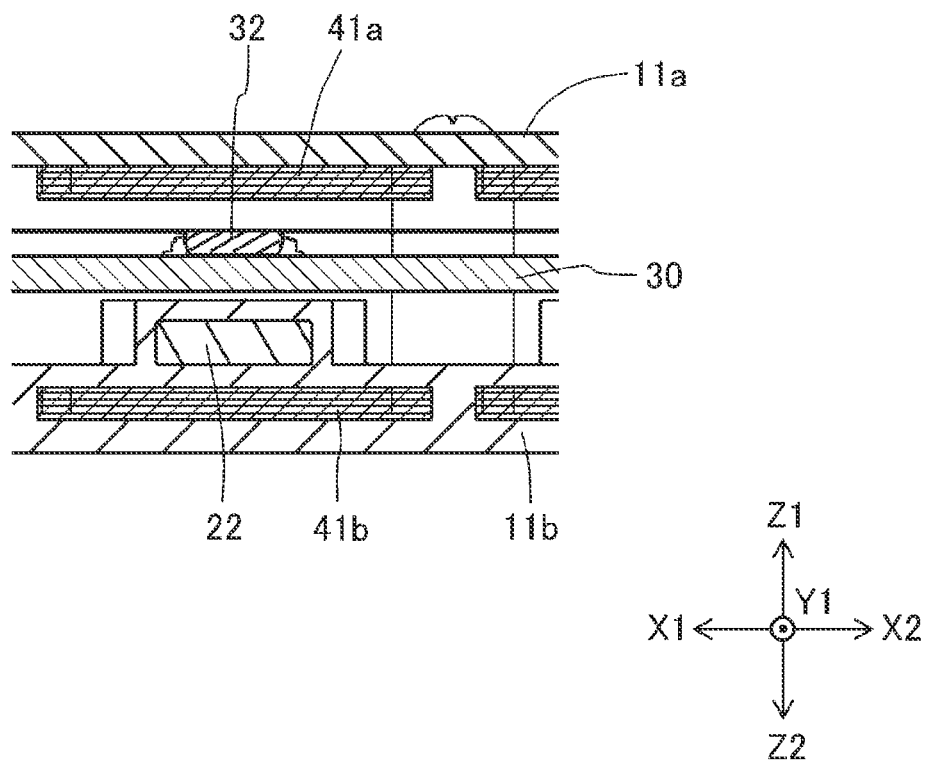
FIG. 2B is a cross-sectional view taken along line IIB-IIB of FIG. 1A.

As shown in FIGS. 1B and 2B, a circuit board 30 is disposed in the casing 11 so as to extend in the longitudinal direction (X1-X2 direction), and magnetic sensors 31, 32, and 33 are disposed at the positions corresponding to the bus bars 21, 22, and 23 in an X-Y plane (a plane including the X1-X2 direction and the Y1-Y2 direction) on the circuit board 30. At least part of the main body of each of the magnetic sensors 31, 32, and 33 faces the corresponding bus bar in the vertical direction.

The magnetic sensors 31, 32, and 33 may be disposed either the upper surface or the lower surface of the circuit board 30. However, the magnetic sensors 31, 32, and 33 are desirably disposed on the same surface.

For example, the magnetic sensor 32 is disposed at the center of the casing 11 in the width direction (Y1-Y2 direction), and the bus bar 22 and the magnetic sensor 32 face each other in the vertical direction, as shown in FIG. 2A. The position of the magnetic sensor 32 in the width direction (X1-X2 direction) of the bus bar 22 shown in FIGS. 1A and 1B and FIGS. 2A and 2B are given as an example only, and specific examples are shown in the individual embodiments. Disposing the magnetic sensor 32 in correspondence with the bus bar 22 allows the magnetic sensor 32 to measure the value of a current flowing through the bus bar 22 (the current to be measured) by detecting a magnetic field induced by the current. An example of the magnetic sensor 32 is a magnetoresistive sensor, such as a giant magnetoresistive sensor (GMR sensor).

The magnetic sensor 32 is sandwiched between a first shield 41a disposed in the cover 11a and a second shield 41b disposed in the case member 11b from above and below. The first shield 41a and the second shield 41b are preferably made of a ferromagnetic substance as a magnetic shield made of a magnetic material and are disposed parallel to each other so as to face each other in the vertical direction. Each of the first shield 41a and the second shield 41b has a configuration in which a plurality of metal plates with the same rectangular shape in plan view and the same size are vertically laminated, and has substantially the same length as that of the circuit board 30 in the width direction (Y1-Y2 direction), as shown in FIG. 2A, and a size so as to cover the bus bar 22 in the longitudinal direction (X1-X2 direction). Furthermore, the first shield 41a and the second shield 41b are aligned so as not to extend off from each other as viewed along the thickness of the bus bar 22. Disposing the first shield 41a and the second shield 41b so as to sandwich the magnetic sensor 32 allows the magnetic sensor 32 to be shielded from an extraneous magnetic field (external magnetic field), such as a magnetic field induced by a current flowing through the adjacent bus bars 21 and 23, thereby reducing the influence thereof.

The layout of the magnetic sensor 32 relative to the bus bar 22, the layout of the two shields 41a and 41b relative to the magnetic sensor 32, and the operation and advantages of the layout apply also to the two magnetic sensors 31 and 33 on both sides of the magnetic sensor 32. The two shields 41a and 41b may be omitted in a case where the influence of the extraneous magnetic field is small.

Figure 3A:
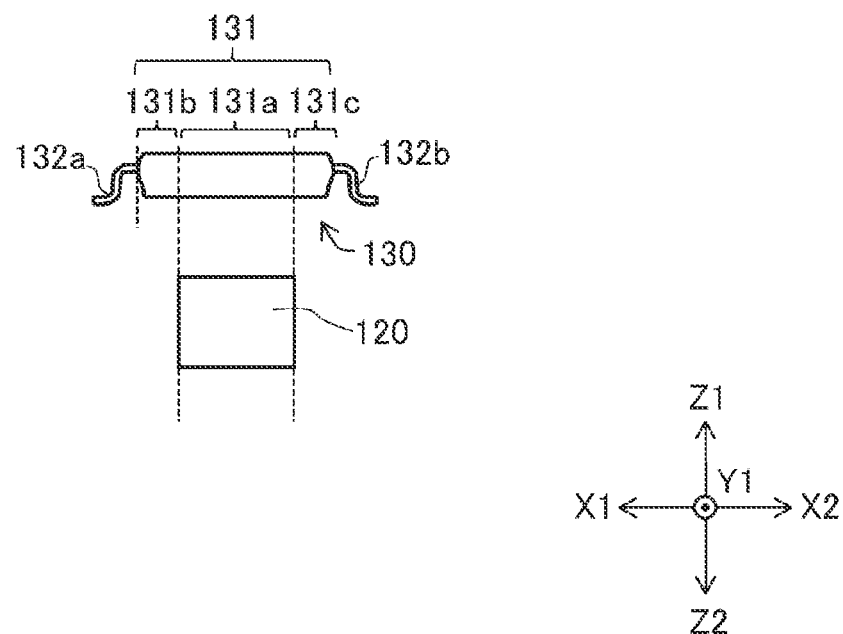
FIG. 3A is a diagram showing the positional relationship between a bus bar and a magnetic sensor in a first embodiment.
Figure 3B:
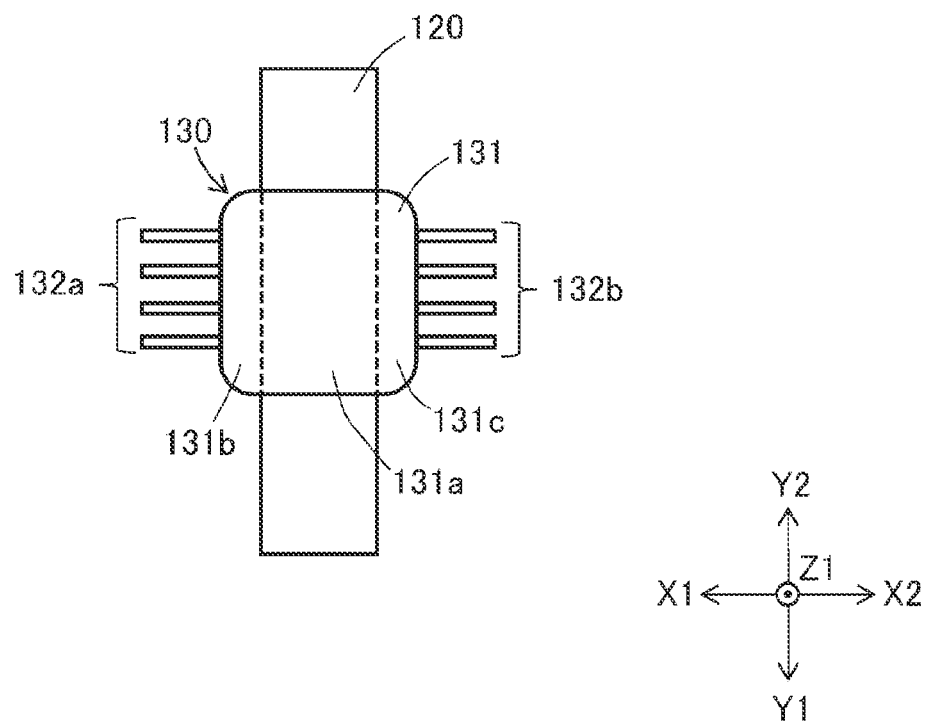
FIG. 3B is a diagram showing the positional relationship between the bus bar and the magnetic sensor in the first embodiment.

FIGS. 3A and 3B are diagrams showing the positional relationship between a bus bar 120 and a magnetic sensor 130 in a first embodiment, in which FIG. 3A is a side view, and FIG. 3B is a plan view. FIGS. 3A and 3B illustrate the shapes of the bus bar 120 and the magnetic sensor 130 in a simplified manner.

In the first embodiment, as shown in FIGS. 3A and 3B, the bus bar 120 and the magnetic sensor 130 with the size relationship as described below are arranged in the current detecting apparatus 10 shown in FIGS. 1A and 1B and FIGS. 2A and 2B, and the magnetic sensor 130 includes terminals as will be described later. The other configuration is the same as that of the current detecting apparatus 10 shown in FIGS. 1A and 1B and FIGS. 2A and 2B, in which a plurality of bus bars 120 made of the same material and having the same shape as those of the bus bars 21, 22, and 23 passes through the casing 11, a plurality of magnetic sensors 130 is disposed on the circuit board 30 in the casing 11 so as to correspond to the individual bus bars 120, and the plurality of magnetic sensors 130 are sandwiched between the two vertically opposing shields 41a and 41b.

As shown in FIGS. 3A and 3B, the bus bar 120 is a plate-like member extending linearly along the width of the casing 11 (in the Y1-Y2 direction, see FIG. 2A) and having thickness in the vertical direction (Z1-Z2 direction) and is made of the same material as that of the bus bars 21, 22, and 23 shown in FIGS. 1A and 1B and FIGS. 2A and 2B.

As shown in FIG. 3B, the magnetic sensor 130 includes a main body 131 having a substantially rectangular shape in plan view viewed along the vertical direction (Z1-Z 2 direction) and having thickness in the vertical direction and a plurality of terminals 132a and 132b extending outward from the sides of the main body 131 (end faces in the width direction of the bus bar 120). The main body 131 detects a magnetic field induced by a current (a current to be measured) flowing through the bus bar 120 facing it to measure the value of the current to be measured and outputs the current value as a detection signal. Both of the magnetic sensor 130 and the bus bar 120 have thickness in the vertical direction. In the following description, the plan view refers to a view seen along the thickness thereof.

The main body 131 may include a first area 131a which overlaps the bus bar 120, and a second area 131b and a third area 131c, which do not overlap the bus bar 120, in plan view seen along the thickness direction. More specifically, the main body 131 may include the first area 131a in the center and the second area 131b and the third area 131c, on both sides, which lie out of the bus bar 120, along the width of the bus bar 120 (X1-X2 direction).

The plurality of terminals 132a extends outward from a side of the second area 131b (the left in FIG. 3B) along the width of the bus bar 120, and the plurality of terminals 132b extends outward from a side of the third area 131c (the right in FIG. 3B) along the width of the bus bar 120. Thus, the plurality of terminals 132a and 132b extend without overlapping the bus bar 120 in plan view.

The plurality of terminals 132a and 132b includes a signal terminal for outputting a detection signal detected by the main body 131 and a supply terminal for supplying electrical power to the main body 131, and in addition to these terminals, a terminal for correcting the detection signal before shipment, for example.

All of the terminals 132a and 132b including the signal terminal and the supply terminal extend outward from the second area 131b and the third area 131c of the main body 131, which do not overlap the bus bar 120 in plan view, respectively, without overlapping the bus bar 120. Thus, all of the terminals 132a and 132b do not face the bus bar 120 in the thickness direction, which allows the terminals 132a and 132b to be distant from the bus bar 120 as compared with a case in which the terminals 132a and 132b face the bus bar 120. This reduces the influence of noise generated from the bus bar 120 at the start or stop of application of a current to the bus bar 120, that is, at ON-Off switching of a voltage for controlling the current to be measured flowing through the bus bar 120. For example, this reduces the influence of noise entering the signal terminal on the components on the circuit board 30 which are electrically connected to the signal terminal.

The circuit board 30 on which the magnetic sensor 130 is disposed may be sandwiched between the two vertically opposing shields 41a and 41b, as shown in FIGS. 2A and 2B. This causes the magnetic sensor 130 on the circuit board 30 to be sandwiched between the first shield 41a and the second shield 41b from above and below, which blocks an extraneous magnetic field, such as a magnetic field induced by a current flowing through adjacent bus bars, reducing the influence thereof.

Figure 4A:
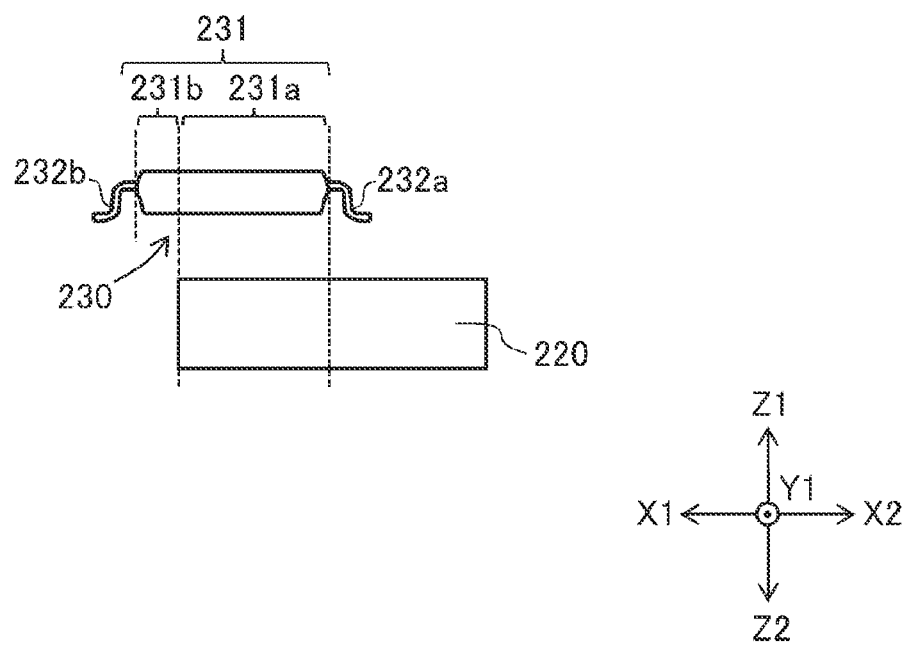
FIG. 4A is a diagram illustrating the positional relationship between a bus bar and a magnetic sensor in a second embodiment.
Figure 4B:
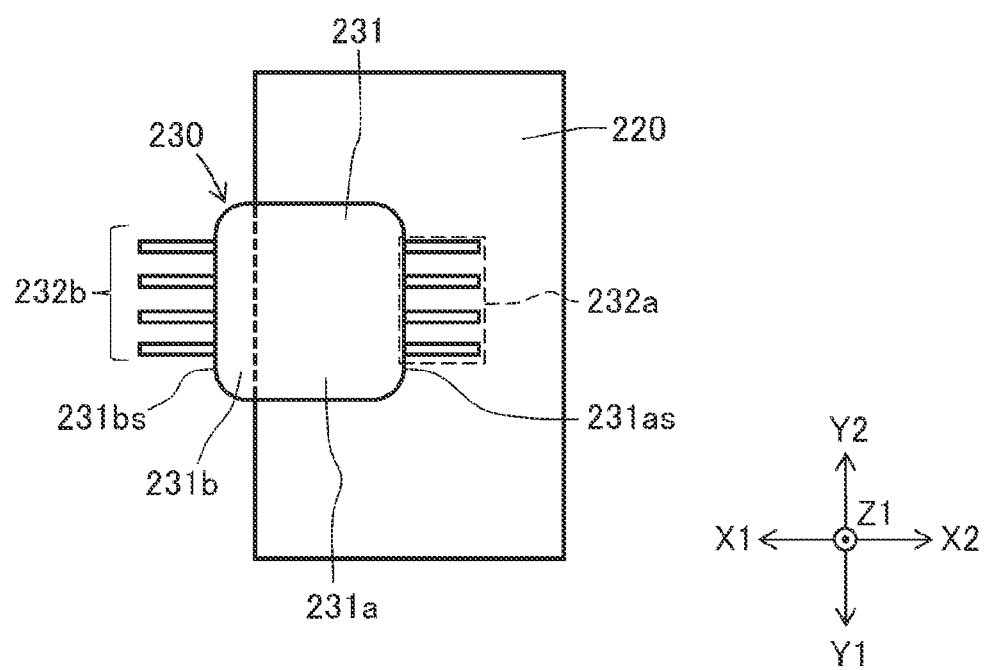
FIG. 4B is a diagram illustrating the positional relationship between the bus bar and the magnetic sensor in the second embodiment.

FIGS. 4A and 4B are diagrams illustrating the positional relationship between a bus bar 220 and a magnetic sensor 230 of a second embodiment, in which FIG. 4A is a side view and FIG. 4B is a plan view. FIGS. 4A and 4B illustrate the shapes of the bus bar 220 and the magnetic sensor 230 in a simplified manner.

In the second embodiment, as shown in FIGS. 4A and 4B, the bus bar 220 and the magnetic sensor 230 with the size relationship as described below are arranged in the current detecting apparatus 10 shown in FIGS. 1A and 1B and FIGS. 2A and 2B, and the magnetic sensor 230 includes terminals as will be described later. The other configuration is the same as that of the current detecting apparatus 10 shown in FIGS. 1A and 1B and FIGS. 2A and 2B, in which a plurality of bus bars 220 made of the same material and having the same shape as those of the bus bars 21, 22, and 23 passes through the casing 11, a plurality of magnetic sensors 230 is disposed on the circuit board 30 in the casing 11 so as to correspond to the individual bus bars 220, and the plurality of magnetic sensors 230 are sandwiched between the two vertically opposing shields 41a and 41b.

As shown in FIGS. 4A and 4B, the bus bar 220 is a plate-like member extending linearly along the width of the casing 11 (in the Y1-Y2 direction) and having thickness in the vertical direction (Z1-Z2 direction) and is made of the same material as that of the bus bars 21, 22, and 23 shown in FIGS. 1A and 1B and FIGS. 2A and 2B.

As shown in FIG. 4B, the magnetic sensor 230 includes a main body 231 having a substantially rectangular shape in plan view viewed along the vertical direction (Z1-Z 2 direction) and having thickness in the vertical direction and a plurality of terminals 232a and 232b extending outward from the sides 231as and 231bs of the main body 231 opposing each other in the X1-X2 direction, respectively. The main body 231 detects a magnetic field induced by a current (a current to be measured) flowing through the bus bar 220 facing it to measure the value of the current to be measured and outputs the current value as a detection signal. Both of the magnetic sensor 230 and the bus bar 220 have thickness in the vertical direction. In the following description, the plan view refers to a view seen along the thickness thereof.

The main body 231 may include a first area 231a which overlaps the bus bar 220 and a second area 231b which does not overlap the bus bar 220, in plan view seen along the thickness direction.

The plurality of terminals 232a individually extends outward from the side 231as of the first area 231a along the width of the bus bar 220. The plurality of terminals 232a extends over the bus bar 220 in plan view. In contrast, the plurality of terminals 232b extends outward from the side 231bs of the second area 231b along the width of the bus bar 220. The plurality of terminals 232b extends without overlapping the bus bar 220 in plan view. In other words, the plurality of terminals 232b extends in a direction distancing away from the bus bar 220.

The plurality of terminals 232b extending from the second area 231b may include a signal terminal for outputting a detection signal detected by the main body 231 and a supply terminal for supplying electrical power to the main body 231. The signal terminal and the supply terminal are not included in the plurality of terminals 232a extending from the first area 231a. In other words, the signal terminal and the supply terminal may extend from only the side 231bs of the two opposing sides 231as and 231bs of the main body 231, which does not overlap the bus bar 220 in plan view, in the direction perpendicular to the extending direction of the bus bar 220. Another terminal other than the signal terminal and the supply terminal, for example, a terminal for correcting the detection signal before shipment, may be extended from either of the sides 231as and 231bs.

The plurality of terminals 232b including the signal terminal and the supply terminal extends outward from the second area 231b of the main body 231, which does not overlap the bus bar 220 in plan view, without overlapping the bus bar 220. Thus, the terminals 232b do not face the bus bar 220 in the thickness direction, which allows the terminals 232b to be distant from the bus bar 220 as compared with a case in which the terminals 232b face the bus bar 220. This reduces the influence of noise generated from the bus bar 220 at ON-Off switching of a voltage for controlling the current to be measured flowing through the bus bar 220, for example, the influence of noise entering the signal terminal on the components on the circuit board 30 which are electrically connected to the signal terminal.

Furthermore, the signal terminal and the supply terminal are provided only on the side 231bs of the two opposing sides 231as and 231bs of the main body 231. This configuration allows the bus bar 220 to be provided in the area facing the first area 231a and from the area in the direction distancing away from the plurality of terminals 232b (X2 direction) while keeping the effect of reducing the influence of noise generated from the bus bar 220.

The circuit board 30 on which the magnetic sensor 230 is disposed is sandwiched between the two vertically opposing shields 41a and 41b, as shown in FIGS. 2A and 2B. This causes the magnetic sensor 230 on the circuit board 30 to be sandwiched between the first shield 41a and the second shield 41b from above and below, which blocks an extraneous magnetic field, such as a magnetic field induced by a current flowing through adjacent bus bars, reducing the influence thereof.

Figure 5:
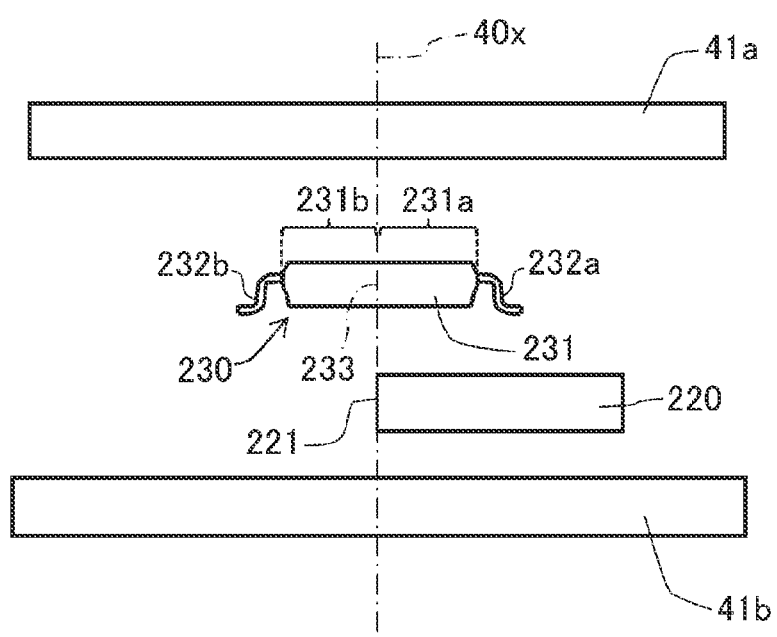
FIG. 5 is a side view of a current detecting apparatus of a modification of the second embodiment, illustrating the layout of two shields, a magnetic sensor, and a bus bar.
Figure 5:
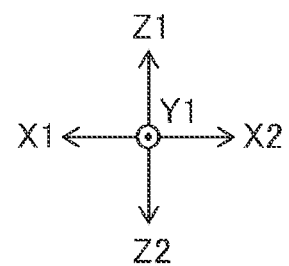

FIG. 5 is a side view of a current detecting apparatus of a modification of the second embodiment, illustrating the layout of the two shields 41a and 41b, the magnetic sensor 230, and the bus bar 220 in a simplified manner. The first area 231a and the second area 231b of the main body 231 of the magnetic sensor 230 may have any size in the width direction of the bus bar 220 (X1-X2 direction). However, disposing the main body 231 so that a plane center 233 is positioned on a widthwise end face 221 of the bus bar 220 so as to be aligned with a plane center 40x common to the two shields 41a and 42b, as shown in FIG. 5, provides a well-balanced effect of reliable reduction of the influence of an extraneous magnetic field and accurate measurement of a current value based on a magnetic field induced by the current flowing through the bus bar 220.

Figure 6:
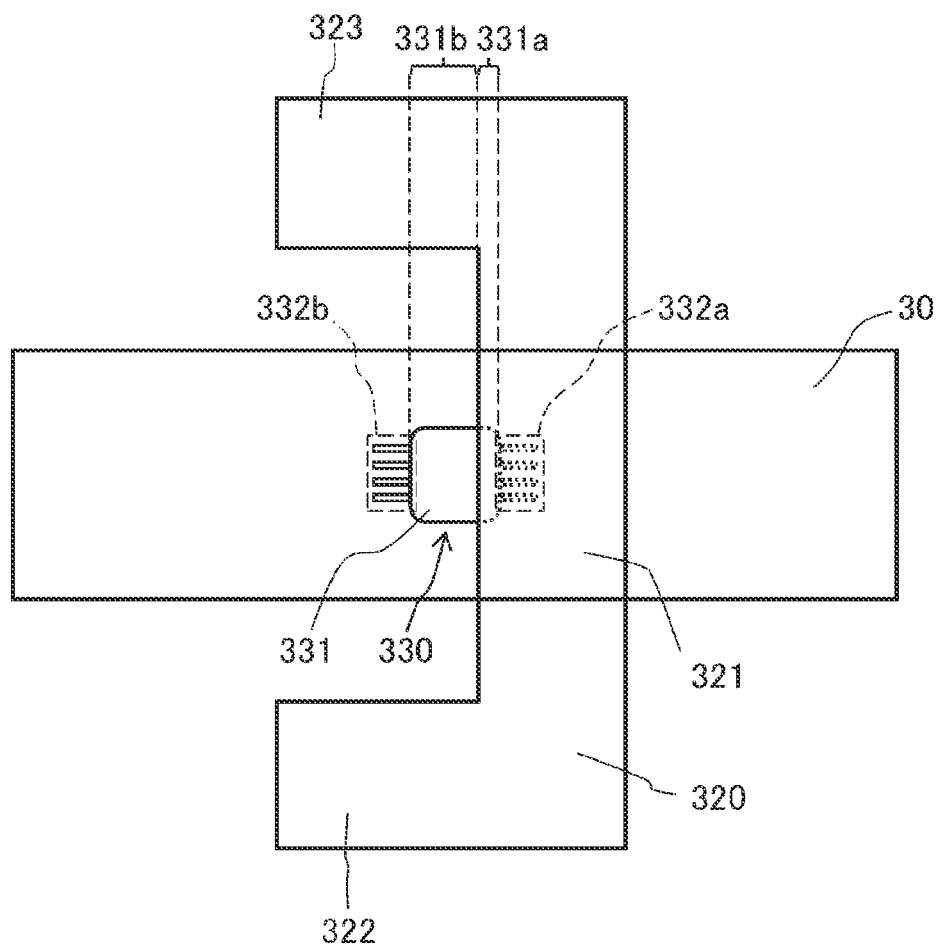
FIG. 6 is a plan view of a bus bar, a magnetic sensor, and a circuit board of a third embodiment, showing the positional relationship among them.
Figure 6:
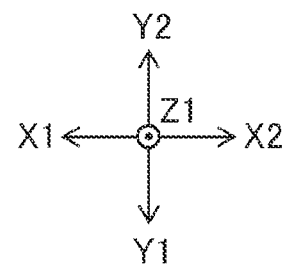

FIG. 6 is a plan view of a bus bar 320, a magnetic sensor 330, and a circuit board 30 of a third embodiment, showing the positional relationship among them. In FIG. 6, the shapes of the bus bar 320, the magnetic sensor 330, and the circuit board 30 are illustrated in a simplified manner, and components on the circuit board 30 other than the magnetic sensor 330 are omitted.

In the third embodiment, as shown in FIG. 6, the bus bar 320 and the magnetic sensor 330 with the size relationship as described below are arranged in the current detecting apparatus 10 shown in FIGS. 1A and 1B and FIGS. 2A and 2B, and the magnetic sensor 330 includes terminals as will be described later. The bus bar 320 includes a base 321 and two extension ends 322 and 323. The other configuration is the same as that of the current detecting apparatus 10 shown in FIGS. 1A and 1B and FIGS. 2A and 2B, in which a plurality of bus bars 320 made of the same material and having the same shape as those of the bus bars 21, 22, and 23 passes through the casing 11, a plurality of magnetic sensors 330 is disposed on the circuit board 30 in the casing 11 so as to correspond to the individual bus bars 320, and the plurality of magnetic sensors 330 are sandwiched between the two vertically opposing shields 41a and 41b.

As shown in FIG. 6, the bus bar 320 may include the base 321 extending linearly along the width of the circuit board 30 (Y1-Y2 direction) and the two extension ends 322 and 323 extending linearly from the opposite ends of the base 321 in the extending direction (Y1-Y2 direction) to the X1 side along the extending direction of the circuit board 30 (X1-X2 direction). The base 321 extends in the direction perpendicular to the extending direction of the circuit board 30 and overlaps a first area 331a, which is part of the main body 331 of the magnetic sensor 330. The two extension ends 322 and 323 may extend, on the opposite longitudinal sides 2 of the base 321, in a direction different from the extending direction of the base 321 of the bus bar 320 and perpendicular to the extending direction. The bus bar 320 is a plate-like member having thickness in the vertical direction (Z1-Z2 direction) and is made of the same material as that of the bus bars 21, 22, and 23 shown in FIGS. 1A and 1B and FIGS. 2A and 2B.

The extension ends 322 and 323 may extend in a direction not perpendicular to the extending direction of the base 321 of the bus bar 320, provided that it is different from the extending direction of the base 321 of the bus bar 320 and not approaching the main body 331. The extension ends may be extended not only to the X1 side, like the extension ends 322 and 323, but also to the X2 side. In other words, the direction not approaching the main body 331 is, for the extension end 322, the range from the Y2 direction to the X1 direction shown in FIG. 6 in the clockwise direction, and for the extension end 323, the range from the X1 direction to the Y1 direction shown in FIG. 6 in the clockwise direction. If the distance from the main body 331 is fixed or increases, the extension ends 322 and 323 do not need to have a belt shape along a fixed direction, for example, a rectangular shape having four sides in the X1-X2 direction and the Y1-Y2 direction.

The magnetic sensor 330 has the same shape and function as that of the magnetic sensor 230 of the second embodiment. The magnetic sensor 330 includes the main body 331 having a substantially rectangular shape with thickness in the vertical direction and a plurality of terminals 332a and 332b extending outward from the opposing sides of the main body 331 in the X1-X2 direction, respectively. The main body 331 includes a first area 331a which overlaps the base 321 of the bus bar 320 and a second area 331b which does not overlap the base 321 of the bus bar 320, in plan view seen along the thickness direction.

The plurality of terminals 332a and 332b are arranged as are the plurality of terminals 232a and 232b of the second embodiment. The terminals 332a extend outward over the base 321 of the bus bar 320, and the terminals 332b extend outward without overlapping the base 321 of the bus bar 320. As in the second embodiment, the terminals 332b extending from the second area 331b include a signal terminal for outputting a detection signal detected by the main body 331 and a supply terminal for supplying electric power to the main body 331. The signal terminal and the supply terminal are not included in the terminals 332a extending from the first area 331a.

Disposing the extension ends 322 and 323 increases the area of the entire bus bar 320 to decrease the resistance of the entire bus bar 320, thereby reducing heat generation while maintaining the effect of reducing the influence of noise generated from the bus bar 320.

The other operations, effects, and modifications are similar to those of the second embodiment.

Having described the present disclosure with reference to the embodiments, it is to be understood that the present disclosure is not limited to the embodiments and modifications and changes may be made within the scope of the object of the modifications and the spirit of the present disclosure.

The magnetic sensors and current detecting apparatuses including the same according to embodiments of the present disclosure are useful in reducing the influence of noise, which can be generated from the bus bar at ON-OFF switching of a voltage for controlling the current to be measured flowing through the bus bar, on the result of measurement made by the magnetic sensors.

What is claimed is:

1. A current detecting apparatus comprising:
a plate-like bus bar; and
a magnetic sensor including a main body that measures a current flowing through the bus bar and terminals extending individually from the two opposing sides of the main body, and wherein:
the terminals include a signal terminal that outputs a detection signal and a supply terminal that supplies electric power to the main body,
the signal terminal and the supply terminal extend from the main body,
the main body includes a portion overlapping the bus bar and a portion not overlapping the bus bar as viewed along a thickness direction of the bus bar, and
the signal terminal and the supply terminal extend from the portion of the main body not overlapping the bus bar without overlapping the bus bar; and
two plate-like magnetic shields having a same shape and same size disposed away from each other so as to sandwich the bus bar and the magnetic sensor in the thickness direction, and wherein:

the two plate-like magnetic shields are disposed parallel to the bus bar and overlapped so as not to extend off from each other as viewed along the thickness direction, and as viewed along the thickness direction, the main body and the two magnetic shields are disposed so that plane centers are aligned with each other, and the plane center of the main body is located on a widthwise end face of the bus bar.

2. The current detecting apparatus according to claim 1, wherein:

the bus bar extends linearly, the signal terminal and the supply terminal are disposed only on one side of the sides of the main body in a width direction perpendicular to an extending direction of the bus bar, and the main body is disposed at a position where the one side does not overlap the bus bar in the width direction of the bus bar as viewed along the thickness direction.

3. The current detecting apparatus according to claim 2, wherein, as viewed along the thickness direction of the bus bar, the bus bar extends, on opposite sides of the portion overlapping the main body in the extending direction, in a direction different from the extending direction of the bus bar and distancing away from the main body or keeping a fixed distance from the main body.

* * * * *